United States Patent [19]
Griffith et al.

[11] Patent Number: 5,693,997
[45] Date of Patent: Dec. 2, 1997

[54] NON-TILTING PLATE ACTUATOR FOR USE IN A MICROPOSITIONING DEVICE

[75] Inventors: Joseph E. Griffith, Berkeley Heights; Rafael N. Kleiman, New Brunswick, both of N.J.

[73] Assignee: Lucent Technologies Inc., Murray Hill, N.J.

[21] Appl. No.: 599,570

[22] Filed: Feb. 9, 1996

[51] Int. Cl.⁶ .............................. H02N 2/00; H01L 41/08
[52] U.S. Cl. .................................... 310/328; 310/366
[58] Field of Search ................................ 310/328, 366

[56] References Cited

U.S. PATENT DOCUMENTS

| | | | |
|---|---|---|---|
| 4,019,073 | 4/1977 | Vishnevsky et al. | 310/328 |
| 5,306,919 | 4/1994 | Elings et al. | 250/442.11 |
| 5,453,653 | 9/1995 | Zumeris | 310/323 |
| 5,616,980 | 4/1997 | Zumeris | 310/323 |

FOREIGN PATENT DOCUMENTS

| 2113459 | 3/1983 | United Kingdom | 310/366 |
|---|---|---|---|

OTHER PUBLICATIONS

Dimensional metrology with scanning probe microscopes—J. E. Griffith et al—J. Appl. Phys., vol. 74, No. 9, Nov. 1, 1993—pp. 83–109.

*Primary Examiner*—Thomas M. Dougherty

[57] ABSTRACT

A non-tilting positioner for a micropositioning device constructed of piezoelectric plate actuators each arranged with a pair of opposed parallel edges respectively coupled to first and second elements. A first surface of each plate is divided into quadrants, with first electrodes in each of the quadrants. At least one second electrode is provided on the opposed surface. Electric voltages are applied to the first and second electrodes with appropriate polarities so as to generate an electric field through the thickness of the plate which is of a first polarity in a first pair of diagonally opposite quadrants and is of the opposite polarity in the second pair of diagonally opposite quadrants. Movement along a line parallel to the plane of the plate is thereby effected. Movement in a third orthogonal direction can also be attained by selecting an appropriate electrode pattern. A compact design with double the range is attained by providing at least two of the aforedescribed actuators which are arranged with their plates in parallel or coplanar relation to each other, with a rigid intermediate element being coupled to one end of each of the actuator plates. This "doubling back" of the plates is inherently thermally compensated and eliminates parasitic vertical motion associated with the desired horizontal motion.

12 Claims, 3 Drawing Sheets

1

NON-TILTING PLATE ACTUATOR FOR USE IN A MICROPOSITIONING DEVICE

BACKGROUND OF THE INVENTION

This invention relates to a small motion transducer positioner for use in a micropositioning device to control the position of a probe tip relative to the surface of a sample under observation and, more particularly, to an improved non-tilting positioner for eliminating Abbé offset error.

Segmented piezoceramic tubes are commonly used as actuators to produce probe tip motion in micropositioning devices such as scanning probe microscopes and profilometers. Such actuators have the advantages of simplicity, long range, small size and stiffness. What is disadvantageous about these actuators is the unpredictable tilting of the end of the tube, which introduces motion that is difficult to measure. This problem, known in the field of dimensional metrology as Abbé offset error, is described, for example, in the article "Dimensional Metrology with Scanning Probe Microscopes", J.Appl.Phys., Volume 74, No. 9, Nov. 1, 1993, pages 83–109. U.S. Pat. No. 5,306,919, issued Apr. 26, 1994, to Elings et al proposes a solution to the problem of unwanted tilting by bending a piezoelectric tube into an S shape. This proposed solution is not entirely satisfactory because the bending leads to unpredictable tilting. It is therefore a primary object of the present invention to provide a positioner for a micropositioning device which eliminates tilting.

It would also be desirable to provide such a positioner which can be used for high speed applications, has a long range, is thermally compensated, can be used for two and three dimensional motion, and is of simple construction. It is therefore another object of the present invention to provide a positioner possessing all of these attributes.

SUMMARY OF THE INVENTION

The foregoing and additional objects are attained in accordance with the principles of this invention by providing a positioning actuator for a micropositioning device to control relative horizontal movement along a line between a pair of elements. The actuator comprises a relatively thin piezoelectric plate having a pair of opposed parallel edges and a pair of opposed parallel surfaces extending between the edges. The plate surfaces are parallel to the line of movement. A first of the edges is coupled to a first of the elements so as to prevent relative movement therebetween and the second of the edges is coupled to the second element so as to prevent relative movement therebetween. A first surface of the plate is divided into roughly equal sections. Each section has one first electrode thereon. The first electrodes are arranged on the plate in a manner that provides at least two rows and at least two columns of first electrodes. The first electrodes in a given row or column are of alternating polarity. In one embodiment of the present invention all of the positive first electrodes on the plate are electrically connected to each other and all of the negative first electrodes on the plate are connected to each other. At least one second electrode is provided on the opposed surface in opposition to the set of first electrodes through the thickness of the plate. A controller is coupled to the electrodes for applying differential electric voltages to the first and second electrodes so as to generate an electric field across the thickness of the plate which is of a first polarity in a first pair of diagonally opposite quadrants and is of the opposite polarity in the second pair of diagonally opposite quadrants.

In accordance with an aspect of this invention, there is provided a positioner which includes a pair of the aforedescribed actuators. The pair of actuators are arranged with their plates in parallel or coplanar relation to each other, with a rigid intermediate element being coupled to one end of each of the actuator plates. This "doubling back" of the plates results in a compact design which is thermally compensated.

In accordance with another aspect of this invention, a two dimensional positioner device comprises a plurality of the aforereferenced positioners arranged in a rectangular array with the plates on each side of the array being parallel to the plates on the opposed side of the array and orthogonal to the plates on the adjacent sides of the array.

In accordance with a further aspect of this invention, an appropriate electrode configuration for each actuator plate can be utilized to achieve three dimensional motion.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figures 1, 2:
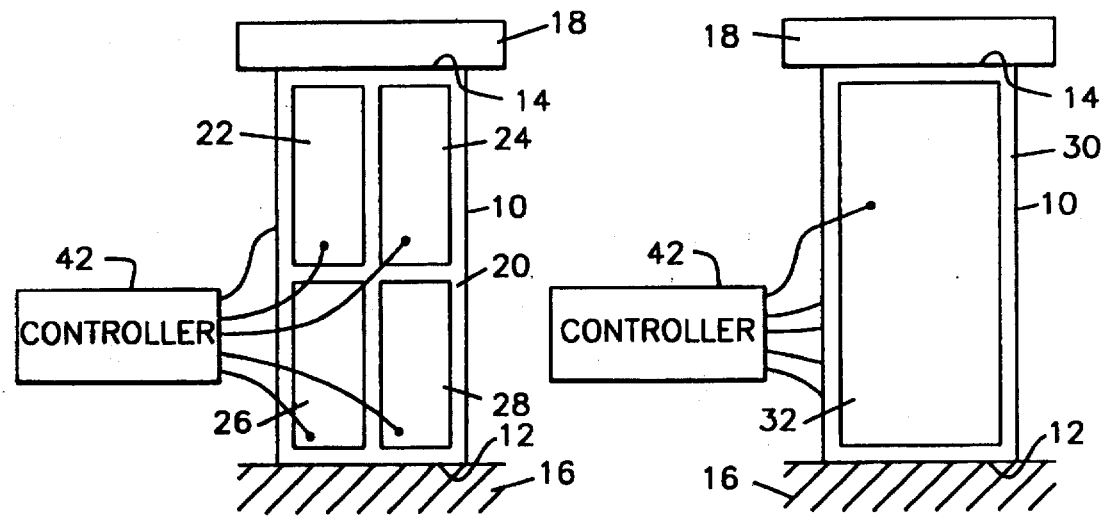
FIG. 1 shows a first side of a one dimensional actuator constructed in accordance with the principles of this invention and which functions as the basic building block of the inventive two dimensional positioner.
FIG. 2 shows a first embodiment of the opposed side of the actuator of FIG. 1.

Before describing the invention in detail, it should be understood that where the description refers to a scanning probe microscope, this is not intended to be a term of limitation. A scanning probe microscope is merely an exemplary form of micropositioning device which is a suitable environment for this invention, another such device being a profilometer. Also, while the description specifically refers to piezoelectric material, other materials, such as electrostrictive and magnetostrictive materials may also be utilized as small motion transducers.

Referring now to the drawings, FIGS. 1–4 illustrate an actuator according to the present invention which is utilized as the basic building block for positioners according to this invention. Thus, as shown, a piezoelectric plate 10, illustratively of PZT material but alternatively of any other suitable material such as a piezoelectric single crystal plate or electrostrictive or magnetostrictive material, has a pair of parallel opposed edges 12, 14. The edge 12 is secured to a first element 16, illustratively a fixed base, so there is no relative movement between the edge 12 and the element 16. Similarly, the edge 14 is secured to a second element 18, illustratively a moveable member, in such a way that there is no relative movement between the edge 14 and the element 18. When used in a scanning probe microscope, the probe tip would typically be mounted to the element 18 in a vertical orientation as viewed in FIG. 1, and the sample whose surface is being scanned would be mounted to a support secured to the base 16. Thus, the present invention is concerned with relative horizontal movement between the elements 16 and 18.

Figures 3, 4:
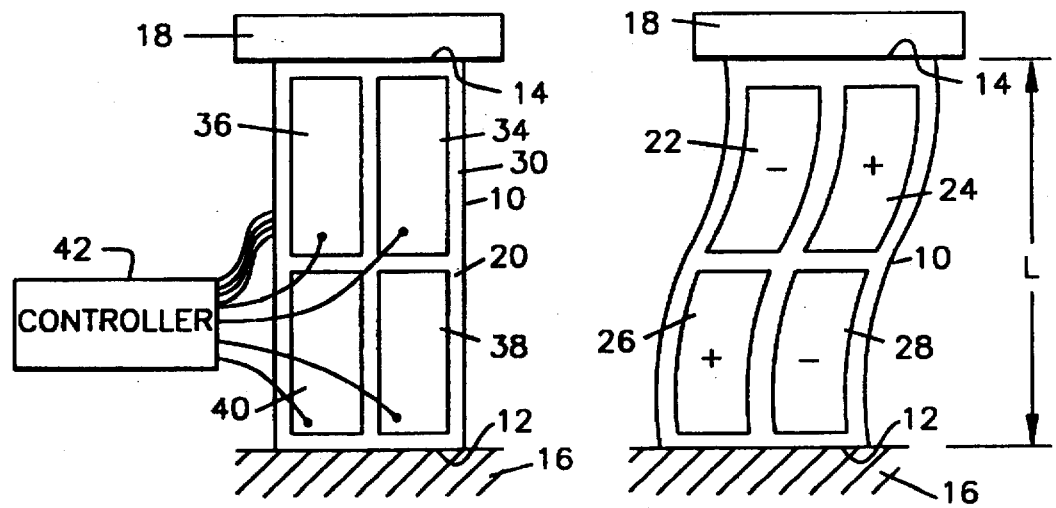
FIG. 3 shows an alternate embodiment of the opposed side of the actuator of FIG. 1.
FIG. 4 illustrates movement of the actuator of FIGS. 1–3.

According to the present invention, electrodes are placed by any appropriate method on the opposed parallel surfaces of the plate 10, these surfaces extending between the edges 12, 14. On a first surface 20, as shown in FIG. 1, there are placed four electrodes 22, 24, 26 and 28, each illustratively rectangular in shape and together dividing the surface 20 into quadrants. On the opposed surface 30 of the plate 10, there is placed at least one electrode in opposition to respective ones of the electrodes 22, 24, 26, 28 through the thickness of the plate 10. In a first embodiment, as shown in FIG. 2, a single electrode 32 is placed on the surface 30, covering at least the area covered by the electrodes on the surface 20. In a second embodiment, as shown in FIG. 3, four rectangular electrodes 34, 36, 38, 40 are placed on the surface 30, each in opposition to a respective one of the electrodes 22, 24, 26, 28 on the surface 20.

All of the electrodes on both of the surfaces 20, 30 are coupled to the controller 42, which may include a programmed computer. The controller 42 applies electric voltages to all of the electrodes so as to generate an electric field across the thickness of the piezoelectric plate 10 which is of a first polarity in a first pair of diagonally opposite quadrants of the surface 20 and is of the opposite polarity in the second pair of diagonally opposite quadrants of the surface 20. Thus, as best seen in FIG. 4, the polarity applied to the electrodes 24 and 26 relative to the Opposing electrode(s) is opposite from the polarity applied to the electrodes 22 and 28 relative to the opposing electrode(s). Therefore, since the piezoelectric material of the plate 10 expands or contracts depending upon the polarity of the electric field therethrough, and since the lower and upper halves of the plate 10 are driven laterally oppositely, the plate 10 partakes of an S-shaped motion which maintains the parallel nature of the edges 12, 14, thereby eliminating tilting of the element 18 relative to the element 16. Accordingly, relative movement between the elements 16, 18 is effected along a line parallel to the surfaces 20, 30 of the plate 10.

Figure 5:
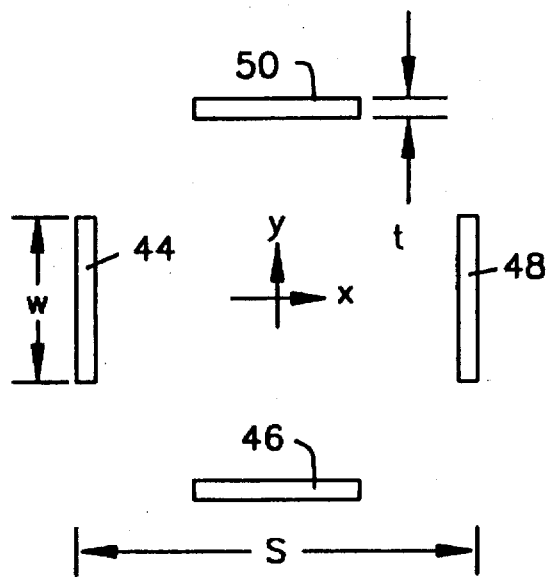
FIGS. 5 and 6 illustrate actuator layouts of two dimensional positioners using actuators of the type illustrated in FIGS. 1–3.

FIG. 5 is a plan view showing how four actuators 44, 46, 48, 50, each of the type described with reference to FIGS. 1–4, are positioned in a rectangular array between the elements 16 and 18 (not shown in FIG. 5) so as to impart two dimensional horizontal movement to the element 18. The plates of the opposing actuators 44, 48 are parallel to each other and orthogonal to the adjacent and mutually parallel plates 46, 50. Movement along the X-axis is controlled by applying appropriate voltages to the electrodes of the actuators 46 and 50 and movement along the Y-axis is controlled by applying appropriate voltages to the electrodes of the actuators 44 and 48.

Figure 6:
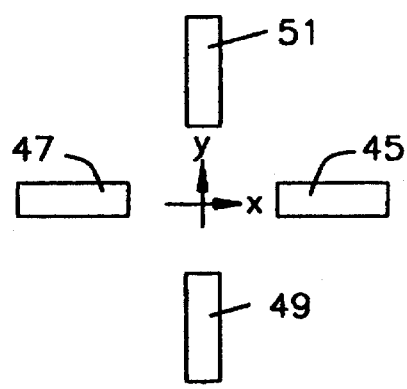

FIG. 6 illustrates a variation on the arrangement shown in FIG. 5 wherein the actuators 45 and 47 control movement along the X-axis and the actuators 49 and 51 control movement along the Y-axis. Although the pairs of actuators are shown as being coplanar, this is not necessary. What is required is that the plane of each actuator be parallel to the line of movement along which the actuator is effective.

Figure 7:
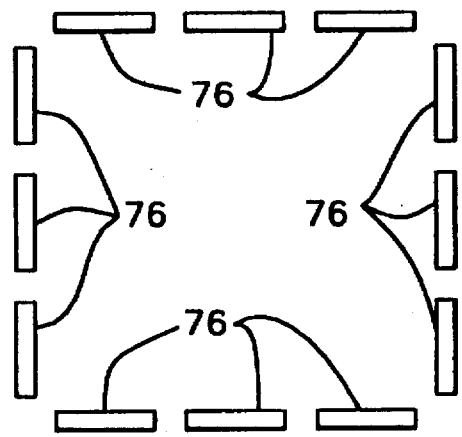
FIG. 7 illustrates the actuator layout of an improved rugged two dimensional positioner using actuators of the type shown in FIGS. 1–3.

One way to minimize tilt is to make a structure whose overall width s (FIG. 5) is large compared to the thickness t of the elements (FIG. 5). However, when dealing with two dimensional movements, using single wide plates for each direction reduces the flexibility. Accordingly, to achieve flexibility in two dimensions and allow for driving in both dimensions, the plates for each direction preferably should be divided into sections, each of which is narrow, and each of which has electrodes segmented as in FIG. 1 to drive it in a translational manner. Thus, a plan view of an advantageous structure is shown in FIG. 7, where each side of the rectangular array has three coplanar positioners 76. A variation to the arrangement shown in FIG. 7 would be to rotate each actuator 76 by 90° around the Z-axis (analogous to the change from FIG. 5 to FIG. 6).

Figure 8:
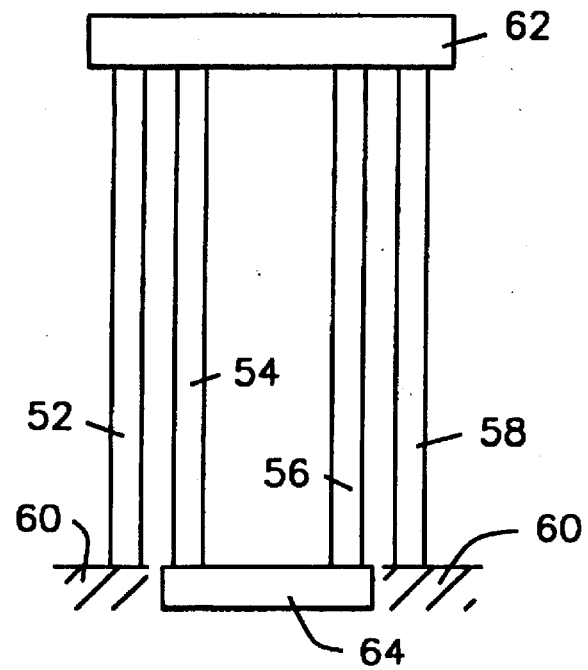
FIGS. 8 and 9 illustrate compact designs for positioners using a plurality of parallel, doubled back, actuators of the type shown in FIGS. 1–3.
Figure 9:
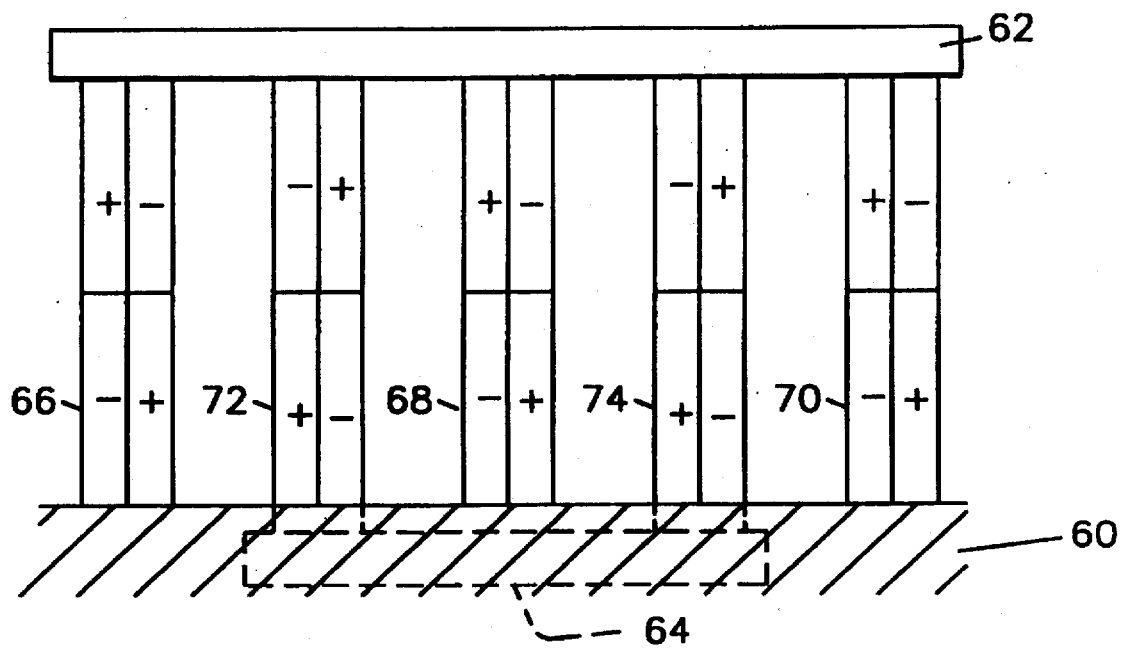

The actuator range can be doubled by building another structure attached to the end of the first structure and aiming back toward the base of the first structure (see FIGS. 8 and 9). This leads to a more compact design for a given range, and is also thermally compensated in the Z-direction. This arrangement also has the advantage of cancelling the parasitic Z-motion associated with the X-Y motion, because the Z motions from the two structures move in opposite directions.

Thus, FIG. 8 shows an illustrative positioner for movement into and out of the plane of the paper having four parallel piezoelectric plates 52, 54, 56, 58. For example, the plates 52, 54 can correspond to the actuator 44 of FIG. 5 and the plates 56, 58 can correspond to the actuator 48 of FIG. 5. In the design shown in FIG. 8, the plates 52, 58 have a first of their parallel edges secured to the base 60 and their opposed parallel edges secured to the rigid intermediate member 62. The plates 54, 56 have their first parallel edges secured to the intermediate member 62 and their opposed parallel edges secured to the member 64. The pair of piezoelectric plates 52, 54 are parallel, adjacent and in overlying relation to each other, as are the pair of piezoelectric plates 56, 58. In a scanning probe microscope, the probe tip (not shown) would be secured to the member 64 (extending downwardly therefrom) and the sample would be secured to the base 60 below the probe tip. The arrangement shown in FIG. 8 possesses a number of advantages. First, it doubles the effective length L (FIG. 4) while maintaining a compact design. Further, as mentioned above, it is thermally compensated in the vertical (Z) direction and automatically cancels the parasitic Z-motion associated with the X-Y motion.

The arrangement shown in FIG. 9 is a variation of the "doubled back", or folded, arrangement shown in FIG. 8. Instead of the actuator plates being arranged as overlying pairs, as in FIG. 8, they can be coplanar, or parallel and offset. Thus, the plates 66, 68, 70 are secured to the base 60 and the rigid intermediate member 62, and the plates 72, 74 are secured to the rigid intermediate member 62 and the member 64. Note that the polarities applied to the electrodes on the plates 66, 68, 70 are opposite to the polarities applied to the corresponding electrodes on the plates 72, 74, so that movement of the plates 72, 74 is additive to movement of the plates 66, 68, 70.

The piezoelectric plates can have their electrodes sectioned in such a way as to get double the range for a fixed voltage from a bipolar supply. When both the front and back of the plate are sectioned into quadrants, as shown in FIGS. 1 and 3, by providing +V/−V across each pair of opposed electrodes, 2V is applied across the segment. If the piezoelectric material can support this voltage, this can result in doubling the range. However, only two dimensional motion can then be accomplished. Alternatively, the back surface of the plate can have a single electrode, as shown in FIG. 2, with the front surface being segmented, as shown in FIG. 1. Then, the back surface electrode can be grounded, allowing only ±V across each segment. This latter arrangement is advantageous in that the back electrode of all of the plates in the array can be floated and varied to facilitate Z-motion as well, giving full three dimensional translational motion.

An exemplary positioner was constructed. This positioner was made of PZT-5A piezoelectric plates, a piezo ceramic material manufactured by Morgan Matroc Inc., which has $d_{31}=1.71$ Å/V. The dimensions were L=1.5", w=0.25", t=0.01", and s=1.50". This resulted in a range of 46 microns/100V drive as measured by observing the displacement under an optical microscope. For ±120 volts as the drive voltage, this resulted in a 110 micron range. The structure doubles back on itself as in FIG. 8. In principle, any PZT material should be able to support 300V/0.5 mm, so by attaching +V to one electrode and −V to the opposed electrode, and using the conventional ±150V supply, the range could also be doubled. The structure has a lowest resonant frequency of about 500 Hz, which is reasonable for many applications. Of course, by changing L, w or t, the range could be increased or decreased with a corresponding decrease or increase in resonant frequency. The measured range and resonant frequency agree with theoretical calculations.

While an exemplary positioner using PZT-5A piezoelectric material was constructed, other materials may also be suitable. For example, other PZT materials as well as lithium niobate single crystal materials and α-quartz single crystal materials may also be selected for the positioner plates.

Accordingly, there has been disclosed an improved non-tilting positioner for a micropositioning device using piezoelectric plate actuators and which eliminates Abbé offset error. While illustrative embodiments have been disclosed herein, it is understood that other embodiments and modifications may be apparent to those of ordinary skill in the art and it is intended that this invention be limited only by the scope of the appended claims.

What is claimed is:

1. A one dimensional positioner for a micropositioning device to control one dimensional horizontal motion along a line of movement between a base and a movable member, the positioner comprising a pair of actuators wherein each of the actuators includes:

a small motion transducer plate having a pair of opposed parallel edges and a pair of opposed parallel surfaces extending between the edges, the surfaces being parallel to the line of movement;

means for coupling a first of said parallel edges to a first element so as to prevent relative movement therebetween;

means for coupling the second of said parallel edges to a second element so as to prevent relative movement therebetween;

wherein the first of said parallel surfaces is divided into a plurality of sections, each section having a first electrode thereon and arranged to provide at least two rows and at least two columns of first electrodes;

at least one second electrode on the second of said parallel surfaces and arranged in opposition to respective ones of said first electrodes through the thickness of said plate; and control means coupled to said first and second electrodes for applying electric voltages to said first and second electrodes so as to generate an electric field across the thickness of said plate which is of a first polarity in a first set of sections and is of the opposite polarity in a second set of sections;

wherein for the first of said actuators the first element is said base and the second element is an intermediate member;

wherein for the second of said actuators the first element is said intermediate member and the second element is said movable member; and wherein the plate of the second of said actuators is in parallel relation to the plate of the first of said actuators and both said first and second actuator plates extend in the same direction from said intermediate member;

whereby desired overall one dimensional movement between said base and said movable member is effected along the line of movement parallel to said actuator plates.

2. The positioner according to claim 1 wherein for each of said actuators said first electrodes consists of four substantially equal size rectangular electrodes each in one of the sections of the first surface.

3. The positioner according to claim 1 wherein for each of said actuators said at least one second electrode consists of a single electrode in opposition to all of said first electrodes.

4. The positioner according to claim 1 wherein for each said actuators said at least one second electrode consists of at least four second electrodes each corresponding, and in opposition, to a respective one of said first electrodes.

5. The positioner according to claim 1 wherein said second actuator plate is adjacent and in overlying relation to said first actuator plate.

6. The positioner according to claim 1 wherein said second actuator plate is coplanar to said first actuator plate.

7. A two dimensional positioner comprising a plurality of one dimensional positioners each as set forth in claim 1 wherein:

said plurality of one dimensional positioners is divided into two groups with the plates of the actuators in each group being parallel to each other and orthogonal to the plates of the actuators in the other group;

whereby independent movement parallel to each axis of an orthogonal axis set can be effected between said base and said movable member.

8. A two dimensional positioner comprising a pair of one dimensional positioners each as set forth in claim 1 wherein a first of said one dimensional positioners is arranged for one dimensional movement parallel to a first of a pair of orthogonal axes and the second one dimensional positioner is arranged for one dimensional movement parallel to the second of said pair of orthogonal axes;

whereby independent movement parallel to each axis of said pair of orthogonal axes can be effected between said base and said movable member.

9. The positioner according to claim 1 wherein each small motion transducer plate is formed from PZT-5A material.

10. The positioner according to claim 1 wherein each small motion transducer plate is formed from material selected from the group consisting of PZT materials, lithium niobate single crystal materials and α-quartz single crystal materials.

11. The positioner according to claim 1 wherein for each of said actuators the first electrodes in each of said rows and columns are of alternating polarity.

12. The positioner according to claim 1 wherein for each of said actuators the first electrodes of a given polarity are electrically connected together.

* * * * *